United States Patent [19]
Okano et al.

[11] Patent Number: 5,965,245
[45] Date of Patent: *Oct. 12, 1999

[54] PREPREG FOR PRINTED CIRCUIT BOARD

[75] Inventors: Norio Okano, Tsukuba; Kazuhito Kobayashi, Yuki; Akishi Nakaso, Oyama, all of Japan

[73] Assignee: Hitachi Chemical Company, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/712,509

[22] Filed: Sep. 13, 1996

[30] Foreign Application Priority Data

| Sep. 13, 1995 | [JP] | Japan | 7-235300 |
| Jan. 26, 1996 | [JP] | Japan | 8-011351 |
| Jan. 26, 1996 | [JP] | Japan | 8-011352 |
| Jan. 26, 1996 | [JP] | Japan | 8-011353 |
| Mar. 21, 1996 | [JP] | Japan | 8-063990 |

[51] Int. Cl.$^6$ .................. B32B 9/00
[52] U.S. Cl. ............ 428/209; 428/297.4; 428/332; 428/338; 428/339; 428/418; 428/901; 428/321.1; 428/384; 174/258
[58] Field of Search ............. 428/320.2, 321.1, 428/209, 210, 297.4, 332, 338, 339, 384, 901; 174/258

[56] References Cited

U.S. PATENT DOCUMENTS

| 3,915,663 | 10/1975 | Glass | 29/182.2 |
| 3,939,024 | 2/1976 | Hoggatt | 156/242 |
| 3,984,598 | 10/1976 | Sarazin et al. | 428/336 |
| 4,087,300 | 5/1978 | Adler | 156/184 |
| 4,313,995 | 2/1982 | Delgadillo | 428/201 |
| 4,338,132 | 7/1982 | Okamoto et al. | 75/208 |
| 4,543,295 | 9/1985 | Clair et al. | 428/458 |
| 4,595,623 | 6/1986 | Du Pont et al. | 428/209 |
| 4,652,413 | 3/1987 | Tiegs | 264/66 |
| 4,662,973 | 5/1987 | Gotou et al. | 156/307.4 |
| 4,833,204 | 5/1989 | Yusa et al. | 525/113 |
| 4,840,763 | 6/1989 | Freitag | 264/65 |
| 4,878,152 | 10/1989 | Sauzade et al. | 428/209 |
| 4,888,247 | 12/1989 | Zweben et al. | 428/105 |
| 4,897,301 | 1/1990 | Uno et al. | 428/209 |
| 4,902,551 | 2/1990 | Nakaso et al. | 428/137 |
| 4,956,315 | 9/1990 | Mehrotra et al. | 501/87 |
| 4,992,325 | 2/1991 | Kim et al. | 428/241 |
| 5,043,184 | 8/1991 | Fujii et al. | 427/96 |
| 5,089,346 | 2/1992 | Imaizumi et al. | 428/458 |
| 5,194,518 | 3/1993 | Shirai et al. | 525/426 |
| 5,219,642 | 6/1993 | Meakin et al. | 428/212 |
| 5,286,330 | 2/1994 | Azuma et al. | 156/323 |
| 5,306,571 | 4/1994 | Dolowy et al. | 428/608 |
| 5,314,740 | 5/1994 | Ishii et al. | 428/209 |
| 5,346,750 | 9/1994 | Hatakeyama et al. | 428/209 |
| 5,382,333 | 1/1995 | Ando et al. | 204/130 |
| 5,397,750 | 3/1995 | Gadkaree | 501/8 |
| 5,449,421 | 9/1995 | Hamajima et al. | 148/415 |
| 5,464,583 | 11/1995 | Lessing | 264/60 |
| 5,552,210 | 9/1996 | Horn, III et al. | 428/209 |
| 5,576,398 | 11/1996 | Takahashi et al. | 525/528 |
| 5,766,386 | 6/1998 | Sakai et al. | 156/62.2 |
| 5,779,870 | 7/1998 | Seip | 205/77 |
| 5,785,789 | 7/1998 | Gagnon et al. | 156/235 |
| 5,792,333 | 8/1998 | Oguro et al. | 205/103 |
| 5,879,568 | 3/1999 | Urasaki et al. | 216/18 |

FOREIGN PATENT DOCUMENTS

| 0057908 | 8/1982 | European Pat. Off. |
| 0196476 | 10/1986 | European Pat. Off. |
| 0441453 | 8/1991 | European Pat. Off. |
| 0566043 | 10/1993 | European Pat. Off. |
| 0633295 | 1/1995 | European Pat. Off. |
| 55-165693 | 12/1980 | Japan |
| 58-139490 | 8/1983 | Japan |
| 62-041400 | 2/1987 | Japan |
| 01145886 | 6/1989 | Japan |
| 01222950 | 9/1989 | Japan |
| 255757 | 2/1990 | Japan |
| A 2-55757 | 2/1990 | Japan |
| 03112644 | 5/1991 | Japan |
| 04026004 | 1/1992 | Japan |
| A 4-29393 | 1/1992 | Japan |
| 441581 | 2/1992 | Japan |
| A 4-1581 | 2/1992 | Japan |
| A 4-36366 | 2/1992 | Japan |
| A 4-120135 | 4/1992 | Japan |
| 04316836 | 11/1992 | Japan |
| 05291712 | 11/1993 | Japan |
| 6196862 | 7/1994 | Japan |
| A 6-200216 | 7/1994 | Japan |
| 07118529 | 5/1995 | Japan |

*Primary Examiner*—Deborah Jones
*Assistant Examiner*—Cathy F. Lam
*Attorney, Agent, or Firm*—Antonelli, Terry, Stout & Kraus, LLP

[57] ABSTRACT

A prepreg comprising a semi-cured thermosetting resin and electrically insulating whiskers or short fibers dispersed in said semi-cured thermosetting resin, and if necessary, a carrier film attached or bound to said prepreg is suitable for producing multilayer printed circuit boards of reduced thinness, high wiring density and high connection reliability with high productivity and low production cost.

35 Claims, 1 Drawing Sheet

PREPREG FOR PRINTED CIRCUIT BOARD

BACKGROUND OF THE INVENTION

This invention relates to a prepreg for printed circuit boards excellent in thinness and denseness of printed circuit boards mounting electronic parts, said prepreg being able to be attached or bound to a carrier film or a copper foil, and processes for producing the prepreg.

Recently, with a tendency of miniaturization and light weight of electronic appliances, a demand for printed circuit boards with a thinner type, a high wiring density and high electronic parts mounting density, surface smoothness for forming very fine wiring and low production cost has been raised year after year.

As insulating materials and interlaminar adhesive materials for printed circuit boards, there have been used prepregs obtained by impregnating woven base materials such as glass cloth, Kevlar cloth, etc. or non-woven base materials such as glass paper, aramide paper, etc. with a thermosetting resin such as an epoxy resin, a polyimide resin, a phenol resin, etc.

Using such prepregs, various methods for obtaining thinner printed circuit boards have been studied. For example, generally used prepregs have a thickness of about 100 to 200 $\mu$m mainly. In order to obtain prepregs having a thickness of 30 $\mu$m after pressed with heating, the distance of stands constituting glass strand used for glass cloth is made large, the resin content is increased and finer stands constituted by finer glass strands are used. But such prepregs have various problems. For example, since the volume percentage of glass strands is low, rigidity decreases and dimensional stability during the step of formation of circuits is lowered. Further, since the glass strands are easily unevenly distributed, concaves and convexes are brought about depending on the presence or no presence of the glass strands. In addition, since the unevenness on a interlayer circuit board is not able to be flattened due to thinness of the board, the unevenness easily appears on the surface after lamination. Moreover, since the rigidity of thin glass cloth per se is low, the glass cloth is easily broken by impregnation with a resin, resulting in making the cost for material higher.

When a prepreg obtained by using such a glass cloth is used as an outer layer in a multilayer printed circuit board, the unevenness of interlayer circuit appears on the surface of the outer layer, unless the thickness of prepreg is made twice or more as large as that of the interlayer copper foil, resulting in making it difficult to obtain the desired thinness.

Further, multilayer printed circuit boards produced by using the prepregs using such glass cloth also have problems in that there easily take place lost of core center of a drill, and damage of the drill during drilling using the drill having a small diameter due to the glass cloth unevenly distributed.

Even if laser drilling is conducted, straight advance of laser beams is lowered due to the presence of glass fibers and drilling precision is lowered. Further, there is another problem of poor surface smoothness due to unevenness of interlayer circuit easily appearing on the surface. Therefore, so long as the prepreg containing such glass cloth base material is used, it is impossible to obtain thinner multilayer printed circuit boards with high wiring density.

Under such circumstances, it is proposed to use a prepreg of insulating resin without containing reinforcing fibers such as glass cloth in place of the prepreg containing glass cloth (e.g. JP-A 6-200216, JP-A 6-242465, etc.).

For example, U.S. Pat. No. 4,543,295 discloses the use of a thermoplastic polyimide adhesive film; JP-A 4-120135 discloses the use of a high molecular weight epoxy resin film having an average molecular weight of 70,000 or more; JP-A 6-200216 discloses the prepreg obtained by introducing silicone units into a polyimide resin rich in film-forming ability; JP-A 4-29393, JP-A 4-36366 and JP-A 4-41581 disclose the prepregs obtained by using as resins acrylonitrile-butadiene rubber/phenol resin, phenol resin/butyral resin, acrylonitrile-butadiene rubber/epoxy resin. Further JP-A 6-196862 discloses a copper foil clad adhesive film obtained by adhering an adhesive film of semi-cured film-forming resin without containing glass cloth to a copper foil.

These prior art techniques, however, have the following problems.

According to U.S. Pat. No. 4,543,295, since the thermoplastic polyimide adhesive film has an adhesion temperature of 250° C., which temperature is higher than the heating temperature of about 170° C. generally employed for printed circuit boards, the insulating material is limited to highly heat resistant polyimide, etc.

According to JP-A 4-120135 and JP-A 6-200216, solvents for diluting the resins are limited to those having high boiling points, resulting in making solvent removal efficiency low after coating and drying for obtaining a film. When the solvent is retained, properties of the resulting printed circuit boards are often damaged.

According to JP-A 4-29393, JP-A 4-36366 and JP-A 4-41581, the insulating materials used therein are poor in chemical resistance, and heat resistance, so that the resulting printed circuit boards are poor in heat resistance and electrical insulating properties.

Further, since these insulating materials do not contain reinforcing fibers, rigidity is low compared with known prepregs. Thus, dimensional stability during the steps for producing printed circuit boards is also low. Further, since the thermal expansion coefficient is extremely larger than those of conductor circuits and electronic parts to be mounted when a printed circuit board is made, breakage of connection portions by soldering easily takes place due to thermal expansion and shrinkage by heating and cooling.

Thus, the above-mentioned insulating materials containing no reinforcing fibers can only be used as interlaminar insulating layers in multilayer printed circuit boards, at present. But, it is necessary to take the low rigidity and large thermal expansion coefficient into consideration when such insulating materials are used. Thus, it is difficult to reduce the production cost.

SUMMARY OF THE INVENTION

It is an object of the preset invention to provide prepregs for printed circuit boards excellent in thinness, high wiring density, high productivity and low production cost.

The present invention provides a prepreg for printed circuit boards comprising a semi-cured thermosetting resin and electrically insulating whiskers or short fibers dispersed in said semi-cured thermosetting resin, and if necessary, said prepreg being formed on a carrier film.

The present invention further provides the prepreg mentioned above, wherein the thermosetting resin has a film-forming ability and disperses electrically insulating whiskers therein without a carrier film.

The present invention also provide the prepreg mentioned above, wherein the thermosetting resin has a film-forming ability or no film-forming ability and disperses electrically insulating whiskers therein without a carrier film.

The present invention still further provides the prepreg mentioned above, wherein the thermosetting resin has no a film-forming ability and disperses electrically insulating whiskers therein and said prepreg is formed on a carrier film.

The present invention also provides the prepreg mentioned above, wherein the electrically insulating whiskers are dispersed in the thermosetting resin and said prepreg is formed on a roughened surface of a copper foil as the carrier film.

The present invention further provides the prepreg mentioned above, wherein the thermosetting resin has no a film-forming ability and disperses electrically insulating short fibers therein and said prepreg is formed on a roughened surface of a copper foil as the carrier film.

The present invention still further provides processes for producing these prepregs.

DESCRIPTION OF THE PREFERRED EMBODIMENTS

Figure 1:
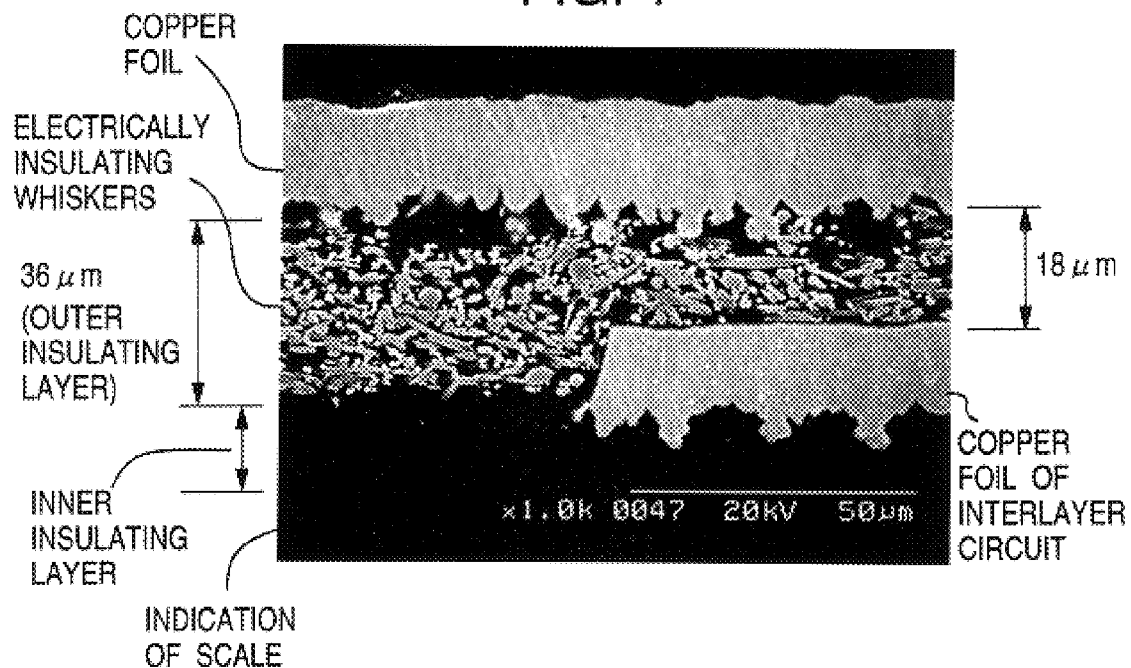
FIG. 1 is an electron microscopic photograph of a cross-section of a circuit board including one example of the prepreg of the present invention.

As mentioned above, miniaturization with light weight, high performance and low cost of electronic appliances proceed and thus, thinness, high wiring density, high productivity, high reliability and low cost of printed circuit boards are demanded. In order to realize the thinness, the reduction of thickness of interlaminar insulating layer between an interlayer circuit layer and an outer circuit layer is required. Thus, the reduction of thickness of prepreg is required.

Further, in order to attain the high wiring density, it is necessary to use fine wirings, which require good surface smoothness.

In addition, fine through-holes and interstitial via holes are required, and good drill processability and good laser drill processability are also required.

In order to improve productivity, it is required to improve wire bonding connection so as to shorten a time for mounting parts, and it is also required to enlarge the work size so as to obtain base plates as much as possible at one time, as well as to make the rigidity of substrate high.

Moreover, in order to obtain high reliability, it is required to improve adhesiveness of plating so as to improve connection reliability of mounted parts and to improve resistance to migration.

In order to satisfy the above-mentioned requirements, the present invention provides a prepreg for printed circuit boards comprising a semi-cured thermosetting resin and electrically insulating whiskers or short fibers (except for glass fibers) dispersed in said semi-cured thermosetting resin, and if necessary, said prepreg being formed on a carrier film.

In the above-mentioned prepreg, the thermosetting resin can either be a resin having a film-forming ability or a resin having no film-forming ability.

The term "film-forming ability" means a function of hardly causing troubles such as cracks or lacking of resins during transport, cutting and lamination of prepregs, and after that hardly causing troubles such as abnormal thinness of an interlaminar insulating layer at a portion having an interlayer circuit, undesirable lowering of interlaminar insulating resistance, and short-circuit of outer layer circuits at the time of thermal press molding.

The term "thermosetting resin" used in the present invention includes not only a thermosetting resin per se, but also a curing agent, a curing accelerator, and if necessary, a coupling agent, a filler, a diluent and conventional additives.

The term "semi-cured" means a thermosetting resin in a B-stage condition.

The prepreg of the present invention is explained in detail as to various embodiments.

[Embodiment A]

The prepreg for printed circuit boards of Embodiment A comprises a semi-cured thermosetting resin having a film-forming ability and electrically insulating whiskers dispersed in the thermosetting resin without having a carrier film.

The above-mentioned prepreg can be produced by a process comprising compounding (or mixing) electrically insulating whiskers with a thermosetting resin having a film-forming ability, dispersing the whiskers in the thermosetting resin uniformly with stirring, coating the resulting mixture on one side of a carrier film, heating the thermosetting resin to a semi-cured state, and removing the carrier film.

(Whiskers)

As the electrically insulating whiskers, there can be used electrically insulating ceramic whiskers preferably having a modulus of elasticity of 200 GPa or more. When the modulus of elasticity is less than 200 GPa, there is s tendency to fail to give a sufficient rigidity when a multilayer printed circuit board is made.

As to the kind of whiskers, there can be used at least one member selected from the group consisting of aluminum borate, wollastonite, potassium titanate, basic magnesium sulfate, silicon nitride, and α-alumina. Among them, since aluminum borate whiskers and potassium titanate whiskers have a Mohs hardness similar to that of E glass generally used in prepreg base material, these whiskers have drill processability similar to that of conventional prepregs. Further, aluminum borate whiskers have a modulus of elasticity of about 400 GPa, which value is by far higher than that of glass, and are relatively low in price. In addition, the aluminum borate whiskers are easily mixed with a resin varnish.

The prepreg containing the aluminum borate whiskers can give a printed circuit board having higher rigidity than that obtained by using a prior art prepreg containing glass cloth at room temperature and under high temperatures, as well as having excellent connecting property by wire bonding and excellent dimensional stability. Thus, in the present invention, the use of the aluminum borate whiskers is most suitable.

The average diameter of electrically insulating whiskers is preferably 0.3 to 3 μm. When the average diameter is less than 0.3 μm, there is a tendency to make the mixing with a resin varnish difficult and to lower coating workability. On the other hand, when the average diameter is larger than 3 μm, there is a tendency to give a bad influence on surface smoothness and to lose uniform dispersion of the whiskers from microscopic point of view.

In order to obtain smoother coating, it is preferable to make the average diameter in the range of 0.5 μm to 1 μm.

The average length of the whiskers is preferably 10 times or more of the average diameter. When the average length is less than 10 times of the average diameter, there is a tendency to lower reinforcing effect as fibers, resulting in failing to obtain sufficient rigidity as a printed circuit board. When the whiskers are too long, uniform dispersion in a resin varnish becomes difficult, resulting in lowering coating workability. Further, when or whisker contacts with one conductor circuit, the probability of the whisker which contacts with another conductor circuit becomes high, resulting in causing migration of copper ions which have a tendency to move along fibers, and bringing about short-circuit between circuits. Therefore, the length of 100 $\mu$m or less is preferable, and 50 $\mu$m or less is more preferable.

It is possible to use whiskers surface-treated with a coupling agent in order to further enhance rigidity and heat resistance of printed circuit boards. The whiskers surface-treated with a coupling agent can also improve wettability with the resin, binding properties, rigidity and heat resistance.

As the coupling agent, there can be used conventional coupling agents such as silicone series, titanium series, aluminum series, zirconium series, zirco-aluminum series, chrome series, boron series, phosphorus series and amino acid series.

(Thermosetting Resin)

As the thermosetting resin having a film-forming ability, there can be used thermosetting resins conventionally used for adhesive films or copper-clad adhesive films.

The resins used for adhesive films and copper-clad adhesive films have a film-forming ability per se, and by dispersing whiskers in the resins according to the present invention, the film-forming ability is further enhanced, resulting in further enhancing insulating reliability.

Further, by dispersing the whiskers in the resins, the amount of resins to be added can be reduced in accordance with the increase of film-forming ability.

As the thermosetting resin having a film-forming ability, there can preferably be used epoxy resins and polyimide resins. Among them, a resin comprising a polyimide resin having silicone units therein and an epoxy resin, and a resin comprising an epoxy resin having a high molecular weight of 500,000 or more and a polyfunctional epoxy resin are particularly preferable.

(Curing Agent)

As the curing agent for such resins, there can be used conventional ones. In the case of epoxy resins, there can be used dicyandiamide, bisphenol A, bisphenol F, polyvinyl phenol, phenol novolak resin, bisphenol A novolak resin, halides or hydrides of these phenol resins.

The curing agent can be used in an amount of conventionally used one, preferably 2 to 100 parts by weight per 100 parts by weight of the resin.

In the case of dicyandiamide, it is preferable to use in an amount of 2 to 5 parts by weight per 100 parts by weight of the resin. In the case of other curing agent, it is preferable to use in an amount of 30 to 80 parts by weight per 100 parts by weight of the resin.

(Curing Accelerator)

As the curing accelerator, there can be used conventional imidazoles, organic phosphorus compounds, tertiary amines, quaternary ammonium salts, etc., when the resin is an epoxy resin.

The curing accelerator can be used in an amount of preferably 0.01 to 20 parts by weight, more preferably 0.1 to 1.0 part by weight, per 100 parts by weight of the resin.

(Solvent)

The thermosetting resin can be used as a resin varnish by diluting with an organic solvent. As the solvent, there can be used acetone, methyl ethyl ketone, toluene, xylene, methyl isobutyl ketone, ethyl acetate, ethylene-glycol monomethyl ether, methanol, ethanol, N,N-dimethylformamide, N,N-dimethylacetamide, etc.

Further, it is also possible to use reactive diluents such as phenyl glycidyl ether, glycidyl methacrylate, dibutyl glycidyl ether, styrene oxide, methyl glycidyl ether, ethyl glycidyl ether, etc.

The solvent as the diluent can be used in an amount of 1 to 200 parts by weight, more preferably 30 to 100 parts by weight, per 100 parts by weight of the resin.

In the Embodiment A, the resin can include conventional one or more coupling agents, fillers, and other conventional additives, if necessary, in addition to the curing agent, curing accelerator and solvent mentioned above.

(Proportion of Whiskers)

The proportion of whiskers in the prepreg is preferably 5 to 50% by volume. When the proportion of whisker in the prepreg is less than 5% by volume, handling of the prepreg becomes worse, for example, the resin is ground finely at the time of cutting to easily fly off, and it is impossible to obtain sufficient rigidity. Further, curl of the prepreg attaching a carrier film becomes larger after drying to make the handling properties more worse. On the other hand, when the proportion of whiskers is more than 50% by volume, hole filling properties in interlayer circuits or resin filling properties into circuits at the time of thermal press molding are damaged, resulting in easily causing voids and blurs (or thin spot) in the whisker dispressed resin layer after thermal press molding to damage properties of the resulting printed circuit board.

In order to attain excellent hole filling properties in interlayer circuits and resin filling properties into circuits, as well as equal or higher rigidity, dimensional stability and wire bonding properties of the produced printed circuit board compared with the printed circuit board using a prior art prepreg containing glass cloth, it is more preferable to use the whiskers in a proportion of 20 to 40% by volume in the prepreg.

(Carrier Film)

As the carrier film, there can be used metal foils such as copper foil, aluminum foil, etc., plastic films such as polyester film, polyimide film, etc. The carrier film may be coated with a mold release agent on the surface. When such a mold release agent is coated, peeling of the prepreg from the carrier film can preferably be improved at the time of lamination working.

The resin varnish containing the whiskers can be applied to the carrier film by using a blade coater, a rod coater, a knife coater, a squeeze coater, a reverse roll coater, a transfer roll coater, etc. It is possible to employ a coating method in which shear strength is loaded in the plane direction parallel to the carrier film, or compression strength is loaded in the direction vertical to the carrier film plane.

[Embodiment B]

The prepreg for printed circuit boards of Embodiment B comprises a semi-cured thermosetting resin having no film-forming ability or having film-forming ability and electrically insulating whiskers dispersed in the thermosetting resin without having a carrier film.

The above-mentioned prepreg can be produced by a process comprising compounding (or mixing) electrically insulating whiskers with a thermosetting resin having film-forming ability or no film-forming ability, dispersing the whiskers in the thermosetting resin uniformly with stirring, coating the resulting mixture on one side of a carrier film, heating the thermosetting resin to a semi-cured state, and removing the carrier film.

As the whiskers, those descried in Embodiment A can be used in the same manner.

As the thermosetting resin, there can be used those having a film-forming ability as mentioned in Embodiment A in the same manner. Further, it is also possible to use those having no film-forming ability.

According to conventional prepregs containing glass cloth, thermosetting resins having no film-forming ability are used. According to prior art technique, since the resin has no film-forming ability, when such a thermosetting resin is coated on a carrier film and semi-cured by removing a solvent with heating, there can easily cause troubles such as cracking of resins and falling of resins during transportation, and cutting and lamination steps. Further, even in the subsequent step of thermal press molding, there also arise troubles such as abnormal thinness of the interlaminar insulating layer at interlayer circuit portions, lowering in interlayer insulating resistance and shirt-circuit.

In contrast, according to the present invention, even if a thermosetting resin has no film-forming ability, since the whiskers are dispersed in the thermosetting resin, the resin is reinforced by the whiskers so as to exhibit the film-forming ability. Thus, cracking and release of resins during the transportation, cutting and lamination step hardly take place. Further, the phenomenon of causing abnormal thinness of interlaminar insulating layer at the time of thermal press molding can be prevented by the presence of whiskers.

As the kind of thermosetting resins having no film-forming ability, there can be used epoxy resins, bismaleimide-triazine resins, polyimide resins, phenol resins, melamine resins, silicone resins, unsaturated polyester resins, cyanic acid ester resins, isocyanate resins, polyamide resins, and various modified resins thereof. Among them, the use of bismaleimide-triazine resins, epoxy resins and polyimide resins are particularly preferable taking properties of printed circuit boards into consideration.

As the epoxy resins, there can be used bisphenol A epoxy resins, bisphenol F epoxy resins, bisphenol S epoxy resins, phenol novolak epoxy resins, cresol novolak epoxy resins, bisphenol A novolak epoxy resins, salicylaldehyde novolak epoxy resins, bisphenol F novolak resins, alicyclic epoxy resins, glycidyl ester epoxy resins, glycidylamine epoxy resins, hydration epoxy resins, isocyanurate epoxy resins, aliphatic cyclic epoxy resins, halides thereof, hydrides thereof, and mixtures thereof. Among them, bisphenol A novolak epoxy resins and salicylaldehyde novolak epoxy resins are more preferable due to excellent heat resistance.

As the curing agent for such thermosetting resins, there can be used those disclosed in Embodiment A in the same manner.

As the curing accelerator, there can be used those disclosed in Embodiment A in the same manner.

As the solvent for dilution, there can be used those disclosed in Embodiment A in the same manner.

In Embodiment B, the thermosetting resin may further contain one or more conventional coupling agents, fillers and other additives, if necessary.

In Embodiment B, the proportions of the whiskers and resin in the prepreg is as disclosed in Embodiment A.

As the carrier film, there can be used those disclosed in Embodiment A.

As the coating method of a resin varnish containing whiskers on a carrier film, there can be used those disclosed in Embodiment A.

[Embodiment C]

The prepreg for printed circuit boards of Embodiment C comprises a semi-cured thermosetting resin having no film-forming ability and electrically insulating whiskers dispersed in the thermosetting resin, said prepreg being attached or bound to (or formed on) a carrier film.

As the whiskers, those disclosed in Embodiment A can be used in the same manner.

As the thermosetting resin having no film-forming ability, those disclosed in Embodiment B can be used in the same manner.

As the curing agent, the curing accelerator, and the solvent for dilution, those disclosed in Embodiment A can be used in the same manner.

In Embodiment C, the thermosetting resin may further contain one or more conventional coupling agents, fillers and other additives, if necessary.

In Embodiment C, the proportions of the whiskers and resin in the prepreg is as described in Embodiment A.

As the coating method of a resin varnish containing whiskers on a carrier film, there can be used those disclosed in Embodiment A.

As the carrier film, there can be used metal foils such as a copper foil, an aluminum foil, etc.; plastic films such as a polyester film, a polyimide film, etc. The carrier film may be coated with a mold release agent on the surface.

When a copper foil is used as a carrier film, the copper foil can preferably be used as a circuit conductor as it is.

The prepreg of Embodiment C can be produced by a process comprising mixing whiskers with a varnish comprising a thermosetting resin having no film-forming ability and an organic solvent, dispersing the whiskers in the varnish uniformly with stirring, coating the varnish on one side of a carrier film, and drying with heating the varnish to remove the solvent and to make the resin semi-cured state.

The resulting prepreg having an insulating adhesive layer on a carrier film can be used as a material for printed circuit boards.

Such a sheet-like insulating layer in plural number can be laminated, followed by pressing with heating to give a material for printed circuit boards.

Further, on a semi-cured prepreg formed on a carrier film after removing the solvent, another prepreg formed on a carrier film is laminated so as to contact individual prepregs, followed by thermal press molding and removal of the carrier film to give another material for printed circuit boards.

In the case of the combination of copper foil/thermosetting resin, the prepreg for printed circuit boards can be produced by a process comprising mixing whiskers with a varnish comprising a thermosetting resin having no film-forming ability and an organic solvent, dispersing the whiskers uniformly in the varnish with stirring, coating the varnish on a copper foil, drying the varnish with heating to remove the solvent and to make the resin semi-cured state.

The resulting copper-clad prepreg can be laminated on another copper-clad prepreg so as to contact the prepregs each other, followed by thermal press molding to give a material for printed circuit boards.

A material for printed circuit boards can also be produced by mixing whiskers with a varnish comprising a thermosetting resin and an organic solvent, dispersing the whiskers in the varnish uniformly with stirring, coating the varnish on one side of a copper foil, drying the varnish with heating to remove the solvent and to make the resin semi-cured state, laminating at least one prepreg containing glass cloth on the resulting copper-clad prepreg so as to contact the prepregs each other, further laminating another copper-clad prepreg on the glass cloth-containing prepreg so as to contact the prepregs each other.

Using the copper-clad prepreg, a printed circuit board can be produced, for example, by a process comprising mixing whiskers with a varnish comprising a thermosetting resin and an organic solvent, dispersing the whiskers in the varnish with stirring, coating the varnish on a carrier film, dry the varnish with heating to remove the solvent and to make the resin semi-cured state, laminating the resulting carrier film-clad prepreg on an interlayer circuit board, removing the carrier film, laminating a copper foil thereon, pressing with heating to give a laminate, drilling holes if necessary, forming a conductor in each inner wall of holes, and if necessary repeating the above-mentioned steps, and conducting outer layer circuit processing.

Another process for producing a printed circuit board comprises mixing whiskers with a varnish comprising a thermosetting resin and an organic solvent, dispersing the whiskers in the varnish uniformly with stirring, coating the varnish on a copper foil, drying the varnish with heating to remove the solvent and to make the resin semi-cured state, laminating another copper-clad prepreg on the resulting copper-clad laminate so as to contact the prepregs each other, pressing with heating, drilling holes if necessary, forming a conductor in each inner wall of holes, and if necessary repeating the above-mentioned steps, and conducting circuit processing.

A further process for producing a printed circuit board comprises mixing whiskers with a varnish comprising a thermosetting resin and an organic solvent, dispersing the whiskers in the varnish with stirring, coating the varnish on one side of a copper foil, drying the varnish with heating to remove the solvent and to make the resin semi-cured state, laminating at least one prepreg containing glass cloth on the resulting copper-clad prepreg so as to contact the prepregs each other, laminating another copper-clad laminate on the prepreg containing glass cloth so as to contact the prepregs each other, pressing with heating, drilling holes if necessary, forming a conductor in each inner wall of holes, and if necessary repeating the above-mentioned steps, and conducting circuit processing.

The term "circuit processing" includes formation of an etching resist, and removal of exposed copper from the etching resist with a conventional chemical etching solution.

The formation of a conductor on inner wall of a hole can be conducted by a conventional electroless plating, or if necessary by electric plating.

[Embodiment D]

The prepreg for printed circuit boards of Embodiment D comprises a semi-cured thermosetting resin having a film-forming ability or having no film-forming ability and electrically insulating whiskers dispersed in the thermosetting resin, said prepreg being formed on a roughened surface of a copper foil.

Such a prepreg formed on a copper foil can be produced by a process comprising mixing electrically insulating whiskers with a thermosetting resin, dispersing the whiskers in the thermosetting resin uniformly with stirring, coating the thermosetting resin on a roughened surface of a copper foil, and heating the thermosetting resin to a semi-cured state.

As the thermosetting resin having film-forming ability, there can be used those disclosed in Embodiment A in the same manner, and as the thermosetting resin having no film-forming ability, there can be used those disclosed in Embodiment B in the same manner.

As the whiskers, these disclosed in Embodiment A can be used in the same manner.

As the curing agent for the thermosetting resins, the curing accelerator, and the solvent for dilution, those disclosed in Embodiment A can be used in the same manner.

In Embodiment D, the thermosetting resin may further contain one or more conventional coupling agents, fillers, and other additives, if necessary.

In Embodiment D, the proportions of the whiskers and resin in the prepreg, and coating of a resin varnish containing the whiskers on the copper foil is as described in Embodiment A.

As the copper foil on which a resin varnish containing the whiskers is to be coated, there can be used electrolytic copper foils, rolled copper foils, ultra-thin copper foils attached to carrier films, conventionally used for printed circuit boards and having a roughened surface at least one side of copper foil.

When a thermosetting resin layer containing the whiskers is formed on a smooth surface of copper foil, it is impossible to secure sufficient adhesion between the thermosetting resin layer containing the whiskers and the copper foil in the prepreg state or multilayer printed circuit board state. Thus, by forming the thermosetting resin layer containing the whiskers on the roughened surface of a copper foil, it is possible to secure sufficient adhesion between the thermosetting resin layer containing the whiskers and the copper foil in the prepreg state or multilayer printed circuit board state.

The thickness of the copper foil is preferably as thin as 30 $\mu$m or less, more preferably 10 $\mu$m or less because of capability of forming fine circuits. In such a case, since the handling of the copper foil per se is difficult, it is preferable to use a copper foil attached to a carrier film.

[Embodiment E]

The prepreg for printed circuit boards of Embodiment E comprises a semi-cured thermosetting resin having no film-forming ability and electrically insulating short fibers except for glass fibers dispersed in the thermosetting resin, said prepreg being formed on a roughened surface of a copper foil.

Such a prepreg formed on a copper foil can be produced by a process comprising mixing the electrically insulating short fibers with a thermosetting resin having no film-forming ability, dispersing the short fibers uniformly in the thermosetting resin, coating the thermosetting resin on a roughened surface of a copper foil, heating the thermosetting resin to a semi-cured state.

The proportion of the short fibers is preferably 5 to 50% by volume per solid content of the thermosetting resin.

As the electrically insulating short fibers except for glass fibers, there can be used highly elastic organic short fibers such as aramide fibers, ultra-high molecular weight polyethylene fibers, polyarylate fibers, poly-p-oxybenzoyl whiskers, poly-2-oxy-6-naphthol whiskers, polyoxymethylene whiskers; and inorganic fibers such as alumina fibers, magnesia fibers, silica fibers, zirconia fibers, etc. Among them, use of aramide short fibers and alumina short fibers is preferable. Particularly, the use of alumina fibers is preferable due to general purpose usage and adding effects.

When the average diameter of electrically insulating short fibers is too small, mixing with a resin varnish becomes difficult and coating workability also lowers, while when the average diameter is too large, bad influences appear on surface smoothness and microscopic uniform dispersion of the electrically insulating short fibers is damaged. Therefore, the average diameter of 0.1 $\mu$m to 15 $\mu$m is preferable. Further, the average diameter of 0.5 $\mu$m to 3 $\mu$m is more preferable due to good coating properties (i.e. smooth coating being easily attained).

The average length of the electrically insulating short fiber is preferably 5 times or more, more preferably 10 times or more, as large as the average diameter due to realization of sufficient rigidity by reinforcing effect as fibers when formed into a printed circuit board. When the electrically insulating short fibers are too long, uniform dispersion of the short fibers in the resin varnish becomes difficult and coating properties also lowers. Therefore, in order to maintain good dispersibility and coating properties, it is preferable that the length of the electrically insulating short fibers is 100 times or less of the average diameter. In the Embodiment E, since such short fibers are used, generation of troubles of short-circuit between circuits due to migration of copper ions in the case of using glass cloth based epoxy resin wherein long fibers of glass is used, can be prevented as in the case of using copper-clad prepreg using no glass cloth.

In order to further enhance rigidity and heat resistance of multilayer printed circuit boards, it is effective to use electrically insulating short fibers surface-treated with a coupling agent such as a silane coupling agent. When the electrically insulating short fibers are surface treated with a coupling agent, it is possible to make wetting properties and binding properties with the thermosetting resin excellent and to improve rigidity and heat resistance of the printed circuit board.

As the coupling agent, there can be used conventional coupling agents of silicone series, titanium series, aluminum series, zirconium series, zirco-aluminum series, chromium series, boron series, phosphorus series, amino acid series, etc.

As the thermosetting resin having no film-forming ability, there can be used those disclosed in Embodiment B in the same manner.

As the curing agent for the thermosetting resin, the curing accelerator and the solvent for dilution, there can be used those disclosed in Embodiment A in the same manner.

The thermosetting resin of Embodiment E can also contain one or more conventional coupling agents, fillers, and other additives, if necessary.

The proportion of the short fibers in the prepreg is too small, handling of the copper-clad prepreg becomes worse, for example, the resin is ground finely at the time of cutting and flown off. When a multilayer printed circuit board is produced by using such a defective copper-clad prepreg, sufficient rigidity cannot be obtained. On the other hand, when the proportion of the short fibers is too large, hole filling properties in interlayer circuits and resin filling properties among circuits are damaged, resulting in easily causing voids and blurs (or thin spots) in the insulating layers after thermal press molding and often damaging properties of printed circuit boards. Thus, the proportion of the short fibers in the prepreg is preferably 5 to 50% by volume.

In order to obtain excellent hole filling properties in interlayer circuits and resin filling properties among circuits and to maintain rigidity, dimensional stability and wire bonding properties equal to or more than those of printed circuit boards obtained by using conventional prepregs using glass cloth, it is more preferable to make the proportion of the short fibers 20 to 40% by volume.

As the copper foil on which a resin varnish containing the short fibers is to be coated, there can be used electrolytic copper foils, rolled copper foils, ultra-thin copper foils attached to carrier films, conventionally used for printed circuit boards and having a roughened surface at least one side of copper foil.

When a thermosetting resin layer containing the short fibers is formed on a smooth surface of copper foil, it is impossible to secure sufficient adhesion between the thermosetting resin layer containing the short fibers and the copper foil in the prepreg state or multilayer printed circuit board state. Thus, by forming the thermosetting resin layer containing the short fibers on the roughened surface of a copper foil, it is possible to secure sufficient adhesion between the thermosetting resin layer containing the short fibers and the copper foil in the prepreg state or multilayer printed circuit board state.

The thickness of the copper foil is preferably as thin as 30 $\mu$m or less, more preferably 10 $\mu$m or less because of capability of forming fine circuits. In such a case, since the handling of the copper foil per se is difficult, it is preferable to use a copper foil attached to a carrier film.

It is preferable that the electrically insulating short fibers take a state of nearly two-dimensional orientation in the prepreg layer (i.e. a state in which the axis direction of electrically insulating short fibers is nearly parallel to the plane of forming the prepreg layer).

Coating of a resin varnish containing electrically short fibers on the copper foil can be carried out in the same manner as described in Embodiment A.

The present invention is illustrated by way of the following Examples, in which all parts and percents are by weight unless otherwise specified.

EXAMPLES OF EMBODIMENT A

EXAMPLE 1

A thermosetting resin varnish was prepared by mixing 100 parts of high molecular weight (weight average molecular weight (Mw)=500,000) brominated epoxy polymer synthesized from textrabromobisphenol A and bisphenol A diglycidyl ether in dimethylacetamide, 20 parts of tolylene diisocyanate blocked with phenol novolak, 30 parts of bisphenol A epoxy resin, phenol novolak in an amount of equivalent weight of the bisphenol A epoxy resin, and 0.5 part of urea silane coupling agent with the dimethylacetamide used for synthesizing the high molecular weight epoxy polymer and cyclohexanone in an amount equivalent to the dimethylacetamide so as to give the resin content of 40%.

To 100 parts of this varnish, 36 parts of aluminum borate whiskers having an average diameter of 0.8 $\mu$m and average fiber length of 20 $\mu$m was added and stirred until the whiskers were dispersed uniformly in the varnish.

The resulting mixture was coated on an aluminum foil having a thicknesses of 20 $\mu$m using a knife coater and dried at 150° C. for 10 minutes to remove the solvents. At the same time, the resin was semi-cured. Then, the aluminum foil was removed to give a prepreg of 30 $\mu$m with semi-cured epoxy resin containing 30% by volume of whiskers uniformly dispersed therein. In the same manner as mentioned above, a prepreg of 100 $\mu$m was also produced.

The produced prepregs did not bring about troubles such as cracks at the time of peeling of aluminum foil and during ordinary handling. Further, the prepregs were able to be cut clearly using a cutter knife and a shear machine without flying off the resin. In addition, no blocking of individual prepregs took place and handling was good.

On both sides of the prepreg of 100 $\mu$m thick, one surface-roughened copper foils of 18 $\mu$m were placed, respectively, so as to face the roughened surface to the prepreg, followed by thermal press molding at 170° C. under a pressure of 2 MPa for 60 minutes to give a copper-clad laminate.

The resulting copper-clad laminate showed flexural modulus of 20 GPa in average of length and width when measured by a three-point bending test in a state of without copper foils.

When 10 copper-clad laminates were piled and subjected to drilling using a drill having a diameter of 0.3 mm, the misregistration of holes in the uppermost laminate and the undermost laminate was less than 20 μm.

The copper-clad laminate was subjected to circuit processing, followed by lamination of the prepreg of 30 μm thick previously produced on both sides of the copper-clad laminate, and one-side-roughened copper foil of 18 μm thick on the 30 μm-thick prepregs so as to contact the roughened surface with the prepreg. After thermal press molding, a multilayer copper-clad laminate containing interlayer circuits therein was produced.

The surface roughness of the multilayer copper-clad laminate was measured using a contact finger type surface roughness meter. The measured portions were on a straight line of 25 mm long on the uppermost surface including portions having interlayer circuits and having no interlayer circuits therebelow.

The level difference between the portion having interlayer circuits and that having no interlayer circuits was less than 3 μm on average of 10 points. This means good surface smoothness showing no troubles for circuit processing.

An electron microscopic photograph of a cross-section of measured portion is shown in FIG. 1. As shown in FIG. 1, the thickness of outer insulating layer is 36 μm when a copper foil of interlayer circuit is not present and 18 μm when a copper foil of interlayer circuit is present; and the resin containing the whiskers is filled sufficiently in a boundary portion between the portion having the copper foil of interlayer circuit and the portion having no copper foil of interlayer circuit. That is, in this Example, since the resin containing the whiskers seems to flow sufficiently into the portion having no copper foil of interlayer circuit, the surface smoothness becomes excellent.

Then, holes having a diameter of 50 μm were formed by etching on predetermined portions on the surface copper foil of the multilayer copper-clad laminate having interlayer circuits therein. The prepreg exposed in the holes was removed by an Impact Laser (a trade name, mfd. by Sumitomo Heavy Industries, Ltd.), followed by smear treatment with a permanganic acid solution, electroless plating and pattern baking etching to form circuits.

On both sides of the resulting multilayer printed circuit board, the prepreg of 30 μm obtained as mentioned above and a one-side-roughened copper foil of 18 μm thick were placed so as to contact the roughened surface with the prepreg, perspectively, followed by thermal press molding to give a multilayer copper-clad laminate having interlayer circuits therein. Holes having a diameter of 50 μm were formed by etching on predetermined portions, and the prepreg exposed in the holes was removed by an Impact Laser, followed by smear treatment with a permanganic acid solution, electroless plating and pattern baking etching to form circuits.

Repeating the above-mentioned steps, a 10-layer printed circuit board was produced. A part of the resulting multilayer printed circuit board was cut and subjected to measurement of flexural modulus under flexural mode of a dynamic thermal mechanical analyzer (DMA).

As a result, the flexural modulus in average of length and width directions was 60 GPa at room temperature and 30 GPa at a high temperature (200° C.). The surface hardness measured by using a Vickers hardness meter was 45.

Further, on a part of this 10-layer printed circuit board, a bare chip was mounted and connected to the surface circuit by wire bonding under conditions of ultrasonic wave output of 1 W, ultrasonic wave output time of 50 μs, bond load of 100 g and wire bonding temperature of 180° C. Good wire bonding was obtained.

On the other hand, an IC of 8 mm wide and 20 mm long was connected to the surface circuit of this 10-layer printed circuit board by soldering. The resulting IC mounted printed circuit board was subjected to a heat cycle test of repeating cycle of at −65° C. and 150° C. As a result, even after 2000 cycles, no breakage of the solder connection portion took place.

When the inner circuits including interstitial via holes of this printed wiring board was subjected to a circuit conductivity test, no troubles such as breakage were admitted.

Comparative Example 1

A thermosetting resin composition comprising 100 parts of bisphenol A novolak epoxy resin, 37 parts of bisphenol A novolak resin, 47 parts of tetrabromo-bisphenol A, 0.5 part of 2-ethyl-4-methylimidazole and 100 parts of methyl ethyl ketone was subjected to impregnation coating of glass cloth of 30 μm thick and glass cloth of 100 μm thick, followed by drying at 150° C. for 10 minutes to remove the solvent and to make the resin semi-cured state. Thus, glass cloth-epoxy prepregs of 45 μm thick and 100 μm thick, each having glass cloth and semi-cured epoxy resin, were produced.

The produced prepregs showed flying of the resin at the time of cutting using a cutter knife and a shear machine.

On both sides of the glass epoxy prepreg of 100 μm thick, a one-side roughened copper foil of 18 μm thick was placed so as to contact the roughened surface with the resin and subjected to thermal press molding at 170° C., under a pressure of 2 MPa for 60 minutes.

The resulting copper-clad laminate was subjected to measurement of flexural modulus by a three-point bending test. As a result, 8 GPa in average of length and width in the state of removal of all the copper foil was obtained.

When 10 copper-clad laminates were piled and subjected to drilling using a drill having a diameter of 0.3 mm, the misregistration of holes in the uppermost laminate and the undermost laminate was more than 50 μm.

The copper-clad laminate was subjected to circuit processing, followed by lamination of the glass epoxy prepreg of 45 μm thick previously produced on both sides of the copper-clad laminate, and one-side-roughened copper foil of 18 μm thick on the 45 μm-thick prepregs so as to contact the roughened surface with the prepreg. After thermal press molding, a multilayer copper-clad laminate containing interlayer circuits was produced.

The surface roughness of the multilayer copper-clad laminate was measured using a contact finger typer surface roughness meter. The measured portions were on a straight line of 25 mm long on the uppermost surface including portions having interlayer circuits and having no interlayer circuits therebelow.

The level difference between the portion having interlayer circuits and that having no interlayer circuits was 9 μm on average of 10 points.

Figure 2:
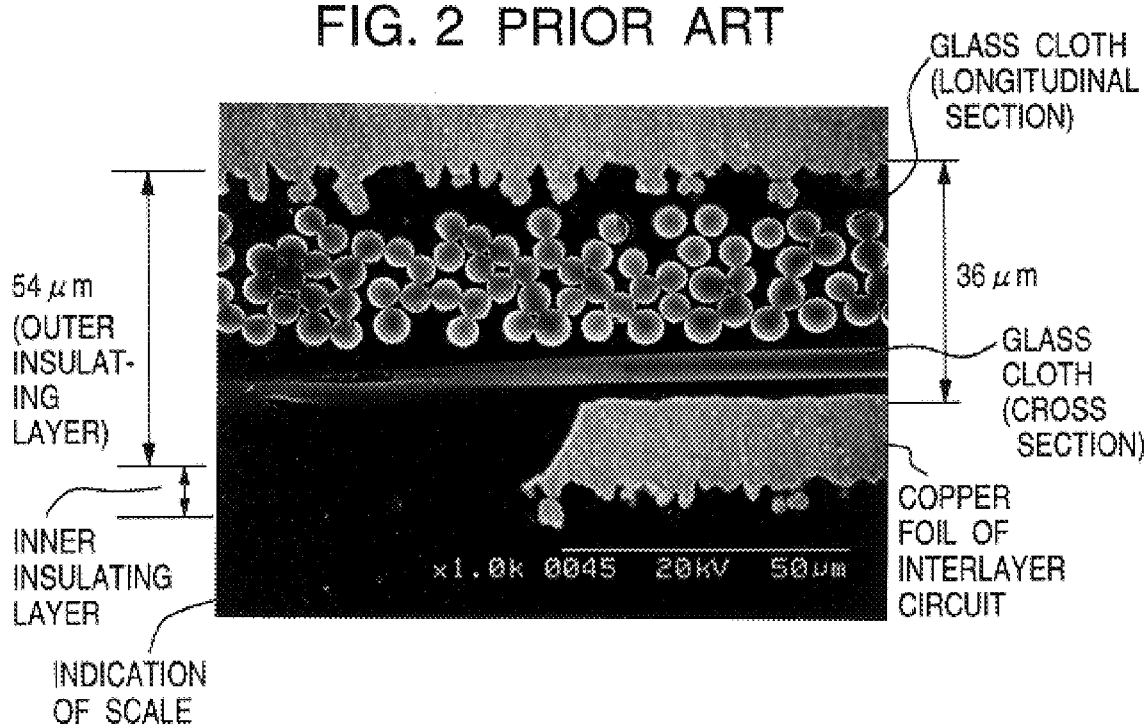
FIG. 2 is an electron microscopic photograph of a cross-section of a circuit board including a prior art prepreg.

An electron microscopic photograph of a cross-section of measured portion is shown in FIG. 2. As shown in FIG. 2, the thickness of outer insulating layer is 54 μm when a copper foil of interlayer circuit is not present, and 36 μm when a copper foil of interlayer circuit is present; and in the portion having no copper foil of interlayer circuit near the boundary of the portion having copper foil of interlayer circuit and that having no copper foil, only the resin is filled and the glass cloth cannot fill the unevenness of interlayer circuits. Since the prepreg has a thickness of 45 μm, no void nor blur was formed, but the thickness requires twice or more as thick as the thickness of the interlayer copper foil. Further, since the outer layer under which no copper foil of interlayer circuit is present easily make a hollow portion, the outer surface is lack of smoothness.

When holes having a diameter of 50 μm were formed on predetermined portions of the surface copper foil of the multilayer copper-clad laminate having interlayer circuits and drilling using an Impact Laser (a trade name, mfd. by Sumitomo Heavy Industries, Ltd.) was tried in such holes, it was impossible to remove the glass portion.

Comparative Example 2

A thermosetting resin varnish was prepared by mixing 100 parts of high molecular weight (Mw=500,0000) brominated epoxy polymer synthesized from tetrabromobisphenol A and bisphenol A diglycidyl ether in dimethylacetamide, 20 parts of tolylene diisocyanate blocked with phenol novolak, 30 parts of bisphenol A epoxy resin, phenol novolak in an amount of equivalent weight of the bisphenol A epoxy resin, and 0.5 part of urea silane coupling agent in the dimethylacetamide used for synthesizing the high molecular weight epoxy polymer and cyclohexanone in an amount equivalent to the dimethylacetamide so as to give the resin content of 40%. The resin composition was coated on a polyethylene terephthalate film using a knife coater. After drying at 150° C. for 10 minutes, the solvent was removed and the resin was semi-cured. Then, the polyethylene terephthalate film was removed by peeling to give an adhesive film of 30 μm thick made of semi-cured epoxy resin.

The thus obtained adhesive film showed no troubles such as cracks at the time of peeling of the polyethylene terephthalate film and ordinary handling. Further, no flying of the resin was observed at the time of cutting using a knife cutter and a shear machine, but blocking between prepregs took place. Thus, handling properties were no good.

On both sides of the interlayer circuit board produced in Comparative Example 1, the adhesive film of 30 μm thick was placed and one-side-roughened copper foil of 18 μm thick was also placed thereon so as to contact the roughened surface with the adhesive film, followed by thermal press molding to give a multilayer copper-clad laminate containing interlayer circuits.

The surface roughness of the multilayer copper-clad laminate containing interlayer circuits was measured using a contact finger type surface roughness meter. The measured portions were on a straight line of 25 mm long on the uppermost surface including portions having interlayer circuits and having no interlayer circuits therebelow.

The level difference between the portion having interlayer circuits and that having no interlayer circuits was less than 3 μm on average of 10 points. This means good surface smoothness showing no troubles for circuit processing.

Then, holes having a diameter of 50 μm were formed by etching on predetermined portions on the surface copper foil of the multilayer copper-clad laminate having interlayer circuits therein. The prepreg exposed in the holes was removed by an Impact Laser, followed by smear treatment with a permanganic acid solution, electroless plating and pattern baking etching to form circuits.

On both sides of the resulting multilayer printed circuit board, the prepreg of 30 μm obtained in Example 1 and a one-side-roughened copper foil of 18 μm thick were placed so as to contact the roughened surface with the prepreg, respectively, followed by thermal press molding at 170° C. under a pressure of 2 MPa for 60 minutes to give a multilayer copper-clad laminate having interlayer circuits therein. Holes having a diameter of 50 μm were formed by etching on predetermined portions, and the prepreg exposed in the holes was removed by an Impact Laser, followed by smear treatment with a permanganic acid solution, electroless plating and pattern baking etching to form circuits.

After repeating the above-mentioned steps, a 10-layer printed wiring board was produced.

A part of the resulting multilayer printed circuit board was cut and subjected to measurement of flexural modulus under flexural mode of DMA. The flexural modulus was 20 GPa under room temperature, and 10 GPa at high temperatures (200° C.). The surface hardness measured by using a Vickers hardness meter was 17.

Further, on a part of this 10-layer printed circuit board, a bare chip was mounted and connected to the surface circuit by wire bonding under conditions of ultrasonic wave output of 1 W, ultrasonic wave output time of 50 μs, and bond load of 100 g. Even when the wire bonding temperature was lowered to 100° C., delamination of wire took place.

On the other hand, a TSOP of 8 mm wide and 20 mm long was connected to the surface circuit of this 10-layer printed circuit board by soldering. The resulting thin small outline package (TSOP) mounted printed circuit board was subjected to a heat cycle of repeating a cycle of at −65° C. and 150° C. As a result, after 100 cycles, breakage of the solder connection portion took place. When the inner circuits including interstitial via holes of this printed circuit board was subjected to a circuit conductivity test, breakage was found.

EXAMPLES OF EMBODIMENT B

EXAMPLE 2

A thermosetting resin composition comprising 100 parts of bisphenol A novolak epoxy resin, 37 parts of bisphenol A novolak resin, 47 parts of tetrabromo-bisphenol A, 0.5 part of 2-ethyl-4-methylimidazole, and 100 parts of methyl ethyl ketone was mixed with aluminum borate whiskers having an average diameter of 0.8 μm and an average fiber length of 20 μm so as to make the whiskers content 90 parts per 100 parts of the solid resin component. Stirring was continued until the whiskers were dispersed in the resin uniformly. Then, the resulting mixture was coated on a polyethylene terephthalate film of 50 μm thick using a knife coater, followed by drying at 150° C. for 10 minutes to remove the solvent and to make the resin semi-cured state. After peeling the polyethylene terephthalate film, prepregs having a thickness of 30 μm and prepregs having a thickness of 100 μm were produced, each prepreg having the whiskers content of 30% by volume.

The resulting prepregs did not show troubles such as cracking at the time of peeling of the polyethylene terephthalate film and during ordinary transportation. Further, when the prepregs were cut using a cutter knife and a shear machine, they are cut clearly without flying off of the resin. In addition, blocking of prepregs did not take place.

On both sides of the prepreg having a thickness of 100 μm, a one-side-roughened copper foil of 18 μm thick was placed so as to contact the roughened surface with the prepreg, followed by thermal press molding at 170° C. under a pressure of 2 MPa for 60 minutes to give a copper-clad laminate.

All the copper foils on both sides of the resulting copper-clad laminate were removed by etching to measure flexural modulus by a three-point bending test. As a result, 20 GPa on average of length and width was obtained.

When 10 copper-clad laminates were piled and subjected to drilling using a drill having a diameter of 0.3 mm, the misregistration of holes in the uppermost laminate and the undermost laminate was less than 20 μm.

Unnecessary portions of the copper foils on both sides of this copper-clad laminate were removed by etching, and circuit processing was conducted. On both sides of the resulting laminate, the prepreg having a thickness of 30 μm and a copper foil of 18 μm were laminated in this order and subjected to thermal press molding at 170° C. under a pressure of 2 MPa for 60 minutes to produce a copper-clad laminate having interlayer circuits therein.

The surface roughness of the copper-clad laminated having interlayer circuits therein was measured using a contact finger type surface roughness meter. The measured portions were on a straight line of 25 mm long on the uppermost surface including portions having interlayer circuits and having no interlayer circuits therebelow. The surface roughness was less than 3 μm on average of 10 points on the boundary portion of the portion having interlayer circuits and the portion having no interlayer circuits.

A cross-section of the measure portion was similar to FIG. 1. The thickness of outer insulating layer was 6 μm when a copper foil of interlayer circuit was not present and 18 μm when a copper foil of interlayer circuit was present; and the resin containing the whiskers was sufficiently filled in the boundary portion between the portion having the copper foil of interlayer circuit and the portion having no copper foil of interlayer circuit. That is, in this Example, since the resin containing the whiskers seems to flow sufficiently into the portion having no copper foil of interlayer circuit, the surface smoothness becomes excellent.

Then, only the outer copper foil portion connected to interlayer circuits of this copper-clad laminate having interlayer circuits therein was removed by etching to form a circular clearance having a diameter of 50 μm without copper foil. This portion was irradiated with laser beams to form a hole for via hole by removing the insulating layer under the copper foil. In order to remove the insulating resin in the hole, smear treatment with a permanganic acid solution was conducted, followed by electroless plating on the whole surface to form a plated copper layer. Unnecessary portions on the plated copper layer were selectively removed by etching to form circuits.

Repeating the above-mentioned steps, a 10-layer printed circuit board was produced.

A part of the resulting multilayer printed circuit board was cut and subjected to measurement of flexural modulus under flexural mode of DMA. As a result, the flexural modulus was 60 GPa at room temperatures, and 40 GPa at 200° C. The surface hardness measured by using a Vickers hardness meter was 45.

Further, on this 10-layer printed circuit board, a bare chip was mounted and connected to the surface circuit by wire bonding under conditions of ultrasonic wave output of 1 W, ultrasonic wave output time of 50 μs, bond load of 100 g and wire bonding temperature of 180° C. Good wire bonding was obtained.

On the other hand, an IC of 8 mm wide and 20 mm long was connected to the surface circuit of this 10-layer printed circuit board by soldering. The resulting IC mounted circuit board was subjected to a heat cycle test of repeating a cycle of at −65° C. and 150° C. As a result, even after 2000 cycles, no breakage of the solder connection portion took place.

When all the circuits including via holes of this printed circuit board was subjected to a circuit conductivity test, no troubles such as breakage were admitted.

EXAMPLE 3

A thermosetting resin composition comprising 100 parts of salicylaldehyde novolak epoxy resin, 70 parts of bisphenol A novolak resin, 1 part of N-methylimidazole, and 100 parts of methyl ethyl ketone was mixed with 90 parts of aluminum borate whiskers having an average diameter of 0.8 μm and an average fiber length of 20 μm per 100 parts of the solid resin content with stirring until uniform dispersion of the whiskers in the resin composition was attained. The resulting mixture was coated on a polyethylene terephthalate film of 50 μm thick using a knife coater, and dried at 150° C. for 10 minutes to remove the solvent and to make the resin semi-cured. Then, the polyethylene terephthalate film was peeled off. Thus, there were obtained prepregs containing the whiskers is 30% by volume with a thickness of 30 μm and 100 μm.

The produced prepregs did not bring about troubles such as cracks at the time of peeling of the polyethylene terephthalate film and during ordinary handling. Further, the prepregs were able to be cut clearly using a cutter knife and a shear machine without flying off the resin. In addition, no blocking of individual prepregs took place and handling was good.

On both side of the prepreg of 100 μm thick, one-surface-roughened copper foils of 18 μm thick were placed, respectively, so as to face the roughened surface to the prepreg, followed by thermal press molding at 170° C. under a pressure of 2 MPa for 60 minutes to give a copper-clad laminate.

All the copper foils on both sides of the copper-clad laminate were removed by etching and subjected to measurement of flexural modulus. The flexural modulus was 20 GPa in average of length and width when measured by a three-point bending test.

When 10 copper-clad laminates were piled and subjected to drilling using a drill having a diameter of 0.3 mm, the misregistration of holes in the uppermost laminate and the undermost laminate was less than 20 μm.

Unnecessary portions of the copper foils on both sides of this copper-clad laminate were removed by etching, and circuit processing was conducted. On both sides of the resulting laminate, the prepreg having a thickness of 30 μm and a copper foil of 18 μm thick were piled in this order, respectively, and subjected to thermal press molding at 170° C. under a pressure of 2 MPa for 60 minutes to give a copper-clad laminate having interlayer circuits therein.

The surface roughness of the copper-clad laminate having interlayer circuits was measured using a contact finger type surface roughness meter. The measured portions were on a straight line 25 mm long on the uppermost surface including portions having interlayer circuits and having no interlayer circuits therebelow. The surface roughness was less than 3 μm on average of 10 points on the boundary portion of the portion having interlayer circuits and the portion having no interlayer circuits.

Then, only the outer copper foil portion connected to interlayer circuits of this copper-clad laminate having interlayer circuits therein was removed by etching to form a circular clearance having a diameter of 50 μm without copper foil. This portion was irradiated with laser beams to form a hole for via hole by removing the insulating layer under the copper foil. In order to remove the insulating resin in the hole, smear treatment with a permanganic acid solution was conducted, followed by electroless plating on the whole surface to form a plated copper layer. Unnecessary portions on the plated copper layer were selectively removed by etching to form circuits.

Repeating the above-mentioned steps, a 10-layer printed circuit board was produced.

A part of the resulting multilayer printed board was cut and subjected to measurement of flexural modulus under flexural mode of DMA. As a result, the flexural modulus was 60 GPa at room temperature and 50 GPa at 200° C. The surface hardness measured by using a vickers hardness meter was 50.

Further on this 10-layer printed circuit board, a bare chip was mounted and connected to the surface circuit by wire bonding under the same conditions as described in Example 2. Good wire bonding was obtained.

On the other hand, an IC of 8 mm wide and 20 mm long was connected to this 10-layer printed circuit board by soldering. The resulting IC mounted circuit board was subjected to a heat cycle test of repeating a cycle of at −65° C. and 150° C. As a result, even after 2000 cycles, no breakage of the solder connection portion took place. When all the circuits including via holes of this printed circuit board was subjected to a circuit conductivity test, no troubles such as breakage were admitted.

Comparative Example 3

A thermosetting resin composition was prepared by mixing 100 parts of high molecular weight (Mw=500,000) brominated epoxy polymer synthesized from tetrabromobisphenol A and bisphenol A diglycidyl ether in dimethylacetamide, 20 parts of tolylene diisocyanate blocked with phenol novolak, 30 parts of bisphenol A epoxy resin, phenol novolak in an amount of equivalent weight of the bisphenol A epoxy resin, and 0.5 part of urea silane coupling agent with the dimethylacetamide used for synthesizing the high molecular weight epoxy polymer and cyclohexanone in an amount equivalent to the dimethylacetamide so as to give the resin content of 40%.

The resulting thermosetting resin composition was coated on a polyethylene terephthalate film of 50 μm thick using a knife coater, followed by drying at 150° C. for 10 minutes to remove the solvents and to make the resin semi-cured. After peeling the polyethylene terephthalate film, an adhesive film of semi-cured epoxy resin having a thickness of 30 μm was prepared.

The thus produced adhesive film showed no troubles such as cracks at the time of peeling of the polyethylene terephthalate film and ordinary handling. Further, no flying of the resin was observed at the time of cutting using a knife cutter and a shear machine, but blocking between prepregs took place. Thus, handling properties were no good.

On both sides of the interlayer circuit board obtained in Comparative Example 1, the adhesive film of 30 μm thick obtained above and a one-side-roughened copper foil of 18 μm thick were piled in this order, respectively, so as to contact the roughened surface with the adhesive film, followed by thermal press molding at 170° C. under a pressure of 2 MPa for 60 minutes to give a multilayer copper-clad laminate having interlayer circuits therein.

The surface roughness of the multilayer copper-clad laminate having interlayer circuits was measured using a contact finger type surface roughness meter. The measured portions were on a straight line of 25 mm long on the uppermost surface including portions having interlayer circuits and having no interlayer circuits therebelow. The surface roughness was less than 3 μm on average of 10 points of level difference between the portion having interlayer circuits and the portion having no interlayer circuits. This means that the surface smoothness was good so as not to give troubles on circuit processing.

Further, predetermined positions on the surface copper foil of the multilayer printed circuit board having interlayer circuits were subjected to etching to form clearances having a diameter of 50 μm. The clearances were irradiated with laser beams to form holes for via holes, followed by smear treatment with a permanganic acid solution, electroless plating on the whole surfaces, and removal of unnecessary plated copper by etching to form circuits. Repeating the above-mentioned steps, a 10-layer printed circuit board was produced.

A part of the resulting multilayer printed circuit board was cut and subjected to measurement of flexural modulus under flexural mode of DMA. As a result, the flexural modulus was 20 PGa at room temperature and 10 GPa at 200° C. The surface hardness measured by using a vickers hardness meter was 17.

Further, on this 10-layer printed circuit board, a bare chip was mounted and connected to the surface circuit by wire bonding under the conditions of ultrasonic wave output of 1 W, ultrasonic wave output time of 50 μs, and bond load of 100 g. Even when the wire bonding temperature was lowered to 100° C., delamination of wire took place.

On the other hand, an IC of 8 mm wide and 20 mm long was connected to this 10-layer printed circuit board by soldering, and subjected to a heat cycle test of repeating a cycle of at −65° C. and 150° C. As a result, after 100 cycles, breakage of solder connection portion took place. When all the circuits including via holes of this printed circuit board was subjected to a circuit conductivity test, breakage was observed at several portions.

EXAMPLES OF EMBODIMENT C

EXAMPLE 4

An epoxy resin varnish was prepared by mixing 100 parts of bisphenol A novolak epoxy resin, 60 parts of bisphenol A novolak resin, 0.5 part of 2-ethyl-4-methylimidazole and 100 parts of methyl ethyl ketone with 67 parts by volume of aluminum borate whiskers having an average diameter of 0.8 μm and an average length of 20 μm per 100 parts by volume of the solid resin component, and stirring the mixture until the whiskers dispersed in the varnish uniformly.

The varnish was coated on a roughened surface of electrolytic copper foil of 18 μm thick using a Comma Coater (a trade name, mfd. by Hirano Technology Co.) which is a kind of a knife coater, followed by drying at 150° C. for 10 minutes to give a semi-cured prepreg formed on a carrier film. The whiskers were contained 30% by volume in the prepreg. The prepreg formed on the carrier film hardly showed warp and was able to be cut clearly using a cutter knife without flying off of the resin.

EXAMPLE 5

A prepreg formed on a carrier film was prepared in the same manner as described in Example 4 except for using the following varnish composition.

| (Varnish composition) | |
| --- | --- |
| Salicylialdehyde novolak epoxy resin | 100 parts |
| Bisphenol A novolak | 70 parts |
| Methyl ethyl ketone | 100 parts |
| 2-Ethyl-4-methylimidazole | 0.5 part |

The whiskers were contained 30% by volume in the prepreg.

The prepreg formed on the carrier film hardly showed warp and was able to be cut clearly using a cutter knife without flying off of the resin.

EXAMPLE 6

A prepreg formed on a carrier film was prepared in the same manner as described in Example 5 except for using potassium titanate whiskers having an average diameter of 0.5 μm and an average length of 20 μm. The whiskers were contained 30% by volume in the prepreg.

The prepreg formed on the carrier film hardly showed warp and was able to be cut clearly using a cutter knife without flying off of the resin.

EXAMPLE 7

On both sides of an interlayer circuit board forming conductor circuits thereon (thickness of an insulating layer 0.1 mm, thickness of copper foil for conductor circuit 18 μm), the prepreg formed on the carrier film prepared in Example 4 was piled so as to contact the prepreg with the conductor circuit, followed by pressing with heating to give an integrated laminate.

All the copper foils on this laminate were removed by etching using a chemical etching solution and subjected to observation of surface appearance with the naked eye. No void nor blur was observed.

The surface roughness was measured using a contact finger type surface roughness meter. An average roughness on 10 points having a large unevenness depending on the presence or no presence of interlayer circuit conductors was less than 3 μm.

When this laminate was casted (buried in an acrylic transparent resin and cured) and the cross-section of it was observed using a scanning electron microscope. The thickness of prepreg layer just above the interlayer circuit was 22 μm, and that having no interlayer circuit was 38 μm.

Then, the copper foils on both sides of this laminate were subjected to processing to form circuits. Further, another prepregs formed on a carrier film were piled so as to contact the prepreg with the conductor circuits, followed by heating under presence to give an integrated laminate. Repeating the above-mentioned steps, a printed circuit board having 10 layers of circuit layers was produced. The final thickness was 0.42 mm.

A part of the resulting multilayer printed circuit board was cut and subjected to measurement of flexural modulus under DMA mode. The flexural modulus in average of length and width directions was 60 GPa at room temperature, and 40 GPa at 200° C. The surface hardness measured by using a Vickers hardness meter was 45.

Further, when a semiconductor chip was mounted on this multilayer printed circuit board and connected thereto by wire bonding, good connection properties were obtained. Then, a semiconductor package was mounted on this multilayer printed circuit board and connected by soldering and subjected to the heat cycle test repeating a cycle of at −65° C. and 150° C. Even after 2000 cycles, no breakage was observed at the soldered connection portion.

EXAMPLE 8

A multilayer printed circuit board was produced in the same manner as described in Example 7 except for using the prepreg formed on a carrier film obtained in Example 5 in place of that obtained in Example 4.

The flexural modulus of this multilayer printed circuit board in average of length and width directions was 60 GPa at room temperature, and 45 GPa at 200° C. The surface hardness measured by using a Vickers hardness meter was 50.

Other properties were the same as those of Example 7.

EXAMPLE 9

A multilayer printed circuit board was prepared in the same manner as described in Example 7 except for using the prepreg formed on a carrier film obtained in Example 6 in place of that obtained in Example 4.

The flexural modulus of this multilayer printed circuit board in average of length and width directions was 50 GPa at room temperature and 40 GPa at 200° C. The surface hardness measured by using a Vickers hardness meter was 40.

Other properties were the same as those of Example 7.

Comparative Example 4

A prepreg formed on a carrier film was prepared in the same manner as described in Example 4 except for not using the whiskers. The resulting prepreg was curled in the direction of injection of a copper foil side. When the prepreg was cut using a cutter knife, the resin near the cutting portion was cracked and flied off vigorously to make the handling difficult.

Comparative Example 5

A multilayer printed wiring board was produced in the same manner as described in Example 7 except for using a prepreg obtained by impregnating glass cloth of 30 μm thick with the resin composition used for preparing the prepreg of Example 4 in place of the prepreg formed on a carrier film used in Example 7.

All the copper foils on both sides thereof were removed by etching using a conventional chemical etching solution, and subjected to observation of surface appearance by the naked eye. Blur (or thin spots) took place on the whole surfaces.

Comparative Example 6

A multilayer printed circuit board was produced in the same manner as described in Example 7 except for using a prepreg obtained by impregnating glass cloth of 30 μm thick with the resin composition used for preparing the prepreg of Example 4 and making the glass cloth content 25% by volume in place of the prepreg formed on a carrier film used in Example 7.

All the copper foils on both sides thereof were removed by etching using a conventional etching solution, and subjected to the measurement of surface roughness. An average surface roughness was 9 μm on 10 portions wherein large unevenness appeared due to presence or no presence of interlayer circuit conductors.

The copper foils on both sides of this laminate was subjected to processing to form circuits, followed by piling of a prepreg formed on a carrier film so as to contact the prepreg with the conductor circuit. After pressing with heating, an integrated laminate was obtained. Repeating the above-mentioned steps, a printed circuit board having 10 circuit layers was produced finally. The resulting thickness was 0.52 mm.

A part of this multilayer printed circuit board was cut and subjected to measurement of flexural modulus under DMA mode. The flexural modulus in average of length and with directions was 40 GPa at room temperature and 20 GPa at 200° C. The surface hardness measured by using a Vickers hardness meter was 17.

Further, a semiconductor chip was mounted on this multilayer printed circuit board and connected by wire bonding. As a result, connection defect was generated partly.

On the other hand, when a semiconductor package was mounted on the multilayer printed circuit board and soldered, and subjected to a heat cycle test repeating a cycle of at −65° C. and 150° C. After about 100 cycles, breakage took place on the solder connection portion.

Comparative Example 7

A multilayer printed circuit board was produced in the same manner as described in Example 7 except for using an epoxy resin having a film-forming ability and a molecular weight of 50,000 or more in place of the prepreg formed on a carrier film used in Example 7.

All the copper foils on both sides were removed by etching using a conventional chemical etching solution and subjected to observation by the naked eye. No void nor blur was observed. The surface roughness was measured on 10 positions wherein large unevenness appeared due to the presence or no presence of interlayer circuit conductors. Average surface roughness was 3 $\mu$m. Further, this laminate was casted and a cross-section thereof was observed using a scanning electron microscope. The thickness of the prepreg layer just above the interlayer circuits was 22 $\mu$m and 38 $\mu$m when no interlayer circuit was present.

Then, the copper foils on both sides of the laminate were subjected to processing to form circuits, followed by piling of a prepreg formed on a carrier film so as to contact the prepreg with the conductor circuits. After pressing with heating, an integrated laminate was produced. Repeating the above-mentioned steps, a printed circuit board having 10 circuit layers was produced finally. The final thickness was 0.42 mm.

A part of the multilayer printed circuit board was cut and subjected to measurement of flexural modulus under DMA mode. The flexural modulus in average of length and width directions was 20 GPa at room temperature and 5 GPa at 200° C. The surface hardness measured by using a Vickers hardness meter was 17.

Further, a semiconductor chip was mounted on the multilayer printed circuit board and connected by wire bonding. As a result, a number of connection defects were generated between the wire and the circuit conductors of the printed circuit board. On the other hand, when a semiconductor package was mounted on the multilayer printed circuit board and soldered, and subjected to a heat cycle test repeating a cycle of at −65° C. and 150° C. After about 200 cycles, breakage took place on the solder connection portion. Further, during the test, the multilayer circuit board was warped greatly to require an require an equipment for repairing the warp for reflow.

EXAMPLE OF EMBODIMENT D

EXAMPLE 10

A thermosetting resin varnish comprising 100 parts of bisphenol A novolak epoxy resin, 37 parts of bisphenol A novolak resin, 47 parts of tetrabromo-bisphenol A, 0.5 part of 2-ethyl-4-methylimidazole and 100 parts of methyl ethyl ketone was mixed with 90 parts of aluminum borate whiskers having an average diameter of 0.8 $\mu$m and an average fiber length of 20 $\mu$m per 100 parts of the solid resin content, and stirred until the whiskers were dispersed in the varnish uniformly.

The resulting mixture was coated on a roughened surface of an electrolytic copper foil of 18 $\mu$m thick using a knife coater, and dried at 150° C. for 10 minutes to remove the solvent and to make the resin semi-cured. Thus, there was obtained a prepreg formed on a copper foil having the whisker content of 30% by volume and a thickness of 30 $\mu$m of the prepreg layer containing semi-cured epoxy resin.

The resulting prepreg formed on a copper foil hardly showed warp and was able to be cut clearly using a cutter knife and a shear machine without flying off of the resin. The hardling properties-were good.

EXAMPLE 11

A prepreg formed on a copper foil was prepared in the same manner as described in Example 10 except for using the following thermosetting resin varnish:

| (Varnish composition) | |
|---|---|
| Salicylaldehyde novolak epoxy resin | 100 parts |
| Bisphenol A novolak resin | 70 parts |
| N-methylimidazole | 1 part |
| Methyl ethyl ketone | 100 parts |

The resulting prepreg formed on a copper foil hardly showed warp and was able to be cut clearly using a cutter knife and a shear machine without flying off of the resin. The handling properties were good.

EXAMPLE 12

Unnecessary portions of copper foils on both sides of double-sided copper-clad laminate having an insulating layer of 0.1 mm thick and each copper foil for conductor of 18 $\mu$m thick were removed by etching. On both sides of the resulting interlayer circuit board, the prepreg formed on a copper foil produced in Example 10 was piled so as to face the prepreg to the interlayer circuit, followed by thermal press molding at 170° C. under a pressure of 2 MPa for 60 minutes to give a multilayer copper-clad laminate having interlayer circuits therein.

All the copper foils of this laminate were removed by etching and subjected to observation of surface appearance by the naked eye. No void nor blur was found.

The surface roughness of this copper-clad laminate was measured by using a contact finger type surface roughness meter. As a result, the surface roughness on a straight line of 25 mm long containing the portions having interlayer circuits and having no interlayer circuits was 3 $\mu$m or less on average of 10 portions.

A section of a part of the measured portions was observed by an electron microscope. The results were similar to FIG. 1. That is, the thickness of outer insulating layer was 36 $\mu$m when the copper foil of interlayer circuit was not present, and 18 μm when the copper foil of interlayer circuit was present. The boundary portion between the portion containing copper foil of interlayer circuits and the portion containing no copper foil of interlayer circuits was sufficiently filled with the resin containing the whiskers. That is, in this Example, the resin containing whiskers seems to move sufficiently to the portion having no copper foil of interlayer circuits. Thus, surface smoothness becomes excellent.

Thus, unnecessary portions of copper foils on both sides of the copper-clad laminate having interlayer circuits therein were removed by etching, followed by piling of the prepreg formed on a copper foil produced in Example 10 so as to face the prepreg to the interlayer circuits. After thermal press molding at 170° C. under a pressure of 2 MPa for 60 minutes, an integrated laminate was obtained. Repeating the above-mentioned steps, there was produced a 10-layer printed circuit board having a thickness of 0.42 mm.

A part of this multilayer printed circuit board was cut and subjected to measurement of flexural modulus under DNA mode. The flexural modulus in average of length and width directions was 60 GPa at room temperature and 40 GPa at 200° C. The surface hardness measured by a Vickers hardness meter was 45.

On a part of the multilayer printed circuit board, a bare chip of IC was mounted and connected by wire bonding to the surface circuit. Every connection was good.

Then, a mega-bite IC of 8 mm wide and 20 mm long was mounted on the multilayer printed circuit board and connected by soldering to the surface circuit, and subjected to the heat cycle test repeating a cycle of at −65° C. and 150° C. Even after 2000 cycles, no defect such as breakage was observed at the soldered connection portion.

EXAMPLE 13

A 10-layer printed circuit board having a thickness of 0.42 mm was produced in the same manner as described in Example 12 except for using the prepreg formed on a copper foil obtained in Example 11 in place of the prepreg formed on a copper foil obtained in Example 10.

The flexural modulus in average of length and width directions of the resulting multilayer printed circuit board was 60 GPa at room temperature, and 50 GPa at 200° C. The surface hardness measured by using a Vickers hardness meter was 50. Other properties were same as those of Example 12.

Comparative Example 8

The thermosetting resin varnish used in Example 10 was coated on a roughened surface of electrolytic copper foil of 18 μm thick using a knife coater, followed by drying at 150° C. for 10 minutes to remove the solvent and to make the resin semi-cured. Thus, there was prepared a prepreg of epoxy resin with 30 μm thick formed on the copper foil.

The resulting prepreg was curled, so that the copper foil surface became convex. When the prepreg was cut with a cutter knife, the resin near the cut portion cracked and vigorously flied off. The handling was difficult.

Comparative Example 9

On both sides of an interlayer board for a multilayer printed circuit board after completion of circuit processing and having an insulating layer of 0.1 mm thick and copper foils for conductors of 18 μm thick, the epoxy resin having no film-forming ability alone used in Example 10 and a prepreg of 30 μm thick containing 30% by volume of glass cloth were piled, followed by lamination of a one-side-roughened electrolytic copper foil on the outside of the prepreg so as to contact the roughened surface with the prepreg. After thermal press molding at 170° C. under a pressure of 2 MPa for 60 minutes, a multilayer printed circuit board having interlayer circuits therein was obtained.

Whole surface of the resulting printed circuit board was etched and subjected to observation of surface appearance by the naked eye. Thin spots were generated on the whole surface.

Comparative Example 10

On both sides of an interlayer board for a multilayer printed circuit board after completion of circuit processing and having an insulating of 0.1 mm thick and copper foils for conductors of 18 μm thick, the epoxy resin having no film-forming ability alone used in Example 10 and a prepreg of 30 μm thick containing 25% by volume of glass cloth were piled, followed by lamination of a one-side-roughened electrolytic copper foil on the outside of the prepreg so as to contact the roughened surface with the prepreg. After thermal press molding as in Comparative Example 9, there was produced a multilayer printed circuit board having interlayer circuits therein.

The whole surfaces of this printed circuit board were etched and subjected to observation of surface appearance by the naked eye. No defect such as void and blur was admitted. The surface roughness of the multilayer printed circuit board having interlayer circuits was measured using a contact finger typer surface roughness meter. As a results, the level difference between the portion having interlayer circuits and the portion having no interlayer circuits was 9 μm on average of 10 points.

A cross-section of a part of the measured portions was observed by an electron microscope. The thickness of outer insulating layer was 54 μm when no copper foil of interlayer circuits was present, and 36 μm when copper foil of interlayer circuits was present. In the portion wherein no copper foil for interlayer circuits was present near the boundary of the portion having copper foil of interlayer circuits and the portion having no copper foil of interlayer circuits, only the resin was filled and the glass cloth was unable to bury the unevenness of interlayer circuits. Since the prepreg had a thickness of 45 μm, even if no void nor thin spot was present, the thickness of twice as large as that of interlayer copper foil was necessary. Further, since the outer layer was easily hollowed on portions having no copper foil for interlayer circuits, it was found that smoothness of outer surfaces was poor.

After conducting outer layer circuit processing on the same multilayer copper-clad laminate having interlayer circuits therein as obtained above, a prepreg having glass content of 25% by volume was laminated on both sides of the resulting copper-clad laminate as mentioned above, followed by thermal press molding. On outer surfaces thereof, a copper foil was laminated and thermal press molded at 170° C. under a presence of 2 MPa for 60 minutes, followed by outer layer circuit processing. Repeating the above-mentioned steps, there was produced a 10-layer printed circuit board of 0.57 mm thick.

A part of this multilayer printed circuit board was cut and subjected to measurement of flexural modulus. As a result, the flexural modulus in average of length and width direction was 40 GPa at room temperature and 20 GPa at 200° C. The surface hardness measured by using a Vickers hardness meter was 17.

Further, when an IC bare chip was mounted on a part of the multilayer printed circuit board and connected to the surface circuit by wire bonding, connection defect took place partly.

On the other hand, an IC of 8 mm wide and 20 mm long with 16 mega-bite was mounted on the multilayer printed circuit board and connected to the surface circuit by soldering, and the heat cycle test repeating a cycle of at −65° C. and 150° C. was conducted. After about 100 cycles, breakage took place on the soldered connection portion.

Comparative Example 11

A thermosetting resin varnish was prepared by mixing 100 parts of high molecular weight (Mw=500,000) brominated epoxy polymer synthesized from tetrabromobisphenol A and bisphenol A diglycidyl ether in dimethylacetamide, 20 parts of tolylene diisocyanate blocked with phenol novolak, 30 parts of bisphenol A epoxy resin, phenol novolak in an amount of equivalent weight of the bisphenol A epoxy resin, and 0.5 part of urea silane coupling agent with the dimethylacetamide used for synthesizing the high molecular weight epoxy polymer and cyclohexanone in an amount equivalent to the dimethylacetamide so as to give the resin content of 40%. The varnish was coated on a roughened surface of electrolytic copper foil in 30 μm thick using a knife coater, followed by drying at 150° C. for 20 minutes to give a semi-cured resin prepreg formed on a copper foil.

On both sides of an interlayer circuit board for multilayer printed circuit board wherein circuit processing was completed, insulating layer had a thickness of 0.1 mm and a copper foil for conductor had a thickness of 18 μm, the above-mentioned prepreg formed on a copper foil was laminated so as to contact the prepreg with the interlayer circuit, followed by thermal press molding at 170° C. under a pressure of 2 MPa for 60 minutes to give a multilayer copper-clad laminate having interlayer circuits therein.

All the copper foils of this multilayer copper-clad laminate were removed by etching and subjected to observation of surface appearance by the naked eye. No defects such as voids and thin spots were observed.

The surface roughness of multilayer copper-clad laminate having interlayer circuits was measured using a contact finger type surface roughness meter. The measured portions were on a straight line of 25 mm long on the uppermost surface including portions having interlayer circuits and having no interlayer circuits therebelow. The surface roughness was 3 μm or less on average of 10 points of level difference between the portion having interlayer circuits and that having no interlayer circuits. Then, the cross-section of the board was observed by scanning electron microscope (SEM) to measure the thickness of the insulating layer. The outer insulating layer on the portion having interlayer circuits was 18 μm and that on the portion having no interlayer circuits was 36 μm.

Unnecessary portions of copper foils on both sides of the multilayer copper-clad laminate having interlayer circuits therein were removed by etching to conduct outer layer circuit processing. On both sides of the resulting laminate, the prepreg formed on a copper foil mentioned above was laminated so as to face the prepreg to the interlayer circuit, followed by thermal press molding at 170° C. under a pressure of 2 MPa for 60 minutes and outer layer circuit processing. Repeating the above-mentioned steps, 10-layer printed circuit board of 0.42 mm was produced.

A part of this multilayer printed circuit board was cut and subjected to measurement of flexural modulus. The flexural modulus in average of length and width directions was 20 GPa at room temperature and 5 GPa at 200° C. The surface hardness measured by using a Vickers hardness meter was 17.

On a part of the 10-layer printed circuit board, a bare chip was mounted and connected to the surface circuits by wire bonding. A number of connection defects took place between the wire and the surface circuits.

Further, an IC of 16 mega-bite with 8 mm wide and 20 mm long was mounted on the 10-layer printed circuit board and connected to surface circuits by soldering and subjected to a heat cycle test repeating a cycle of at −65° C. and 150° C. After about 200 cycles, breakage took place on the soldered connection portion. In the solder reflow step for connecting the IC, since the warp of this 10-layer printed circuit board was larger than that of the boards of Example 12 and Comparative Example 10, it was necessary to attach a special equipment to the board for preventing warp during the reflow.

As mentioned above, the prepregs formed on a copper foil obtained in Example 10 and 11 show a film-forming ability by mixing of the whiskers and good handling properties compared with the prepreg of Comparative Example 8 wherein handling properties are not good due to containing no whiskers.

Further, the multilayer printed circuit boards obtained in Examples 12 and 13 using the prepregs formed on a copper foil of Examples 10 and 11 show excellent thinness and surface smoothness compared with the case of using the prepregs of Comparative Examples 9 and 10 wherein glass cloth is used. Further, the multilayer printed circuit boards of Examples 12 and 13 are excellent in rigidity, dimensional stability and wire bonding connection properties compared with those of Comparative Examples 10 and 11.

EXAMPLES OF EMBODIMENT E

EXAMPLE 14

To an epoxy resin varnish comprising 100 parts of bisphenol A novolak epoxy resin, 55 parts of bisphenol A novolak resin, 0.5 part of 2-ethyl-4-methylimidazole and 100 parts of methyl ethyl ketone, said epoxy resin having no film-forming ability, aramide short fibers having an average diameter of 12 μm and an average fiber length of 150 μm was added in an amount so as to make the short fibers content 30% by volume per 100 parts of the solid resin content and stirred until the short fibers dispersed in the varnish uniformly. The resulting mixture was coated on a roughened surface of an electrolytic copper foil of 18 μm thick using a knife coater, followed by drying at 150° C. for 10 minutes to remove the solvent and to make the resin semi-cured state. As a result, there was obtained a prepreg of 60 μm thick of semi-cured epoxy resin containing short fibers in 30% by volume and formed on a copper foil.

The resulting prepreg formed on a copper foil showed almost no warp and was able to be cut clearly by a cutter knife and a shear machine without flying off of the resin. Thus, handling properties were good.

EXAMPLE 15

To an epoxy resin varnish comprising 100 parts of bisphenol A novolak epoxy resin, 60 parts of bisphenol A novolak resin, 0.5 part of 2-ethyl-4-imidazole and 100 parts of methyl ethyl ketone, said epoxy resin having no film-forming ability, alumina short fibers having an average diameter of 3 μm and an average fiber length of 50 μm was added in an amount so as to make the short fibers content 30% by volume per 100 parts of the solid resin content and stirred until the short fibers dispersed in the varnish uniformly. The resulting mixture was coated on a roughened surface of an electrolytic copper foil of 18 μm thick using a knife coater followed by drying at 150° C. for 10 minutes to remove the solvent and to make the resin semi-cured state. As a result, there was obtained a prepreg of 60 μm thick of semi-cured epoxy resin containing short fibers in 30% by volume and formed on a copper foil.

The resulting prepreg formed on a copper foil showed almost no warp and was able to be cut clearly by a cutter knife and a shear machine without flying off of the resin. Thus, handling properties were good.

EXAMPLE 16

Unnecessary portions of copper foils of a double-sided copper-clad laminate having an insulating layer of 0.1 mm thick and copper foil for conductor of 18 μm thick were removed by etching to give an interlayer circuit board, followed by lamination of the prepreg formed on a copper foil and obtained in Example 14 on both sides of the interlayer circuit board so as to face the prepreg to the interlayer circuit. Then, thermal press molding was conducted at 170° C. under a pressure of 2 MPa for 60 minutes to give a multilayer copper-clad laminate having interlayer circuits.

The thermal expansion coefficient of the multilayer copper-clad laminate after removal of outer copper foils measured by using a thermal mechanical analyzer (TMA) was 10 ppm/° C. in average of length and width directions (at room temperature). The flexural modulus in average of length and width directions of the multilayer copper-clad laminate was 25 GPa at room temperature and 15 GPa at 200° C. The surface hardness measured by using a Vickers hardness meter was 30. The surface roughness was 3 μm or less on average of 10 points. Further, the prepreg formed on a copper foil showed good circuit filling properties and hole filling properties.

EXAMPLE 17

A multilayer copper-clad laminate was produced in the same manner as described in Example 16 except for using the prepreg formed on a copper foil and obtained in Example 15 in place of that obtained in Example 14, and subjected to the same measurements as in Example 16.

The thermal expansion coefficient (after removal of outer layer copper foils) was 12 ppm/° C. (at room temperature). The flexural modulus in average of length and width directions was 23 GPa at room temperature and 16 GPa at 200° C. The surface hardness measured by using a Vickers hardness meter was 37.

Other properties were the same as those of Example 16.

Comparative Example 12

An epoxy resin varnish comprising 100 parts of bisphenol A novolak epoxy resin, 60 parts of bisphenol A novolak resin, 0.5 part of 2-ethyl-4-methylimdazole, and 100 parts of methyl ethyl ketone, said epoxy resin having no film-forming ability was coated on a roughened surface of an electrolytic copper foil of 18 μm thick using a knife coater, followed by drying at 150° C. for 10 minutes to remove the solvent and to make the resin semi-cured state. Thus, a prepreg of 60 μm formed on a copper foil was produced.

The thus produced prepreg was curled, so that the copper foil surface became convex. When the prepreg was cut with a cutter knife, the resin near the cut portion cracked and vigorously flied off. Thus, the prepreg was unable to be used as material for multilayer printed circuit boards.

Comparative Example 13

The same thermosetting resin varnish as used in Comparative Example 11 was coated on a roughened surface of an electrolytic copper foil of 18 μm thick using a knife coater, followed by drying at 150° C. for 10 minutes to remove the solvent and to make the resin semi-cured state. Thus, a prepreg layer of semi-cured epoxy resin of 60 μm thick formed on a copper foil was obtained.

The resulting prepreg formed on a copper foil showed almost no warp and was able to be cut clearly using a cutter knife and a shear machine without flying off of the resin. Thus, handling properties were good.

Comparative Example 14

A multilayer copper-clad laminate having interlayer circuits therein was produced in the same manner as described in Example 16 except for using the prepreg formed on a copper foil and obtained in Comparative Example 13, and subjected to measurements of various properties.

The thermal expansion coefficient (after removal of outer layer copper foils) was 30 ppm/° C. (at room temperature). The flexural strength in average of length and width directions was 8 GPa at room temperature and 3 GPa at 200° C. The surface hardness measured by using a Vickers hardness meter was 18.

Other properties were the same as those of Example 16.

As mentioned above, the prepreg of the present invention is excellent in a film-forming ability and handling properties, so that it is suitable for providing multilayer printed circuit boards of reduced thinness, high wiring density and high connection reliability with high productivity and low production cost.

What is claimed is:

1. A prepreg for printed circuit boards comprising a semi-cured thermosetting resin and electrically insulating whiskers or short fibers, except for glass fibers, dispersed in said semi-cured thermosetting resin, said thermosetting resin having no film-forming ability by itself, yet which has a film-forming ability when having said electrically insulating whiskers or short fibers dispersed therein, said whiskers having an average length of 100 μm or less and said short fibers having an average length of 100 times or less of an average diameter of the short fibers, said average diameter of the short fibers being in a range of 0.1 μm to 15 μm, whereby migration of copper ions along the whiskers or fibers is prevented.

2. A prepreg according to claim 1, wherein the whiskers have a modulus of elasticity of 200 GPa or more.

3. A prepreg according to claim 1, wherein the whiskers are aluminum borate whiskers.

4. A prepreg according to claim 1, wherein said semi-cured thermosetting resin, having the electrically insulating whiskers or short fibers dispersed therein, is provided on a carrier film.

5. A prepreg according to claim 4, wherein the electrically insulating whiskers are dispersed in the thermosetting resin, and wherein said thermosetting resin is formed on a roughened surface of a copper foil as the carrier film.

6. A prepreg according to claim 5, wherein the whiskers have an average diameter of 0.3 μm to 3 μm, and the whiskers have an average length in a range of from 10 times as large as the average diameter 100 μm.

7. A prepreg according to claim 5, wherein the whiskers are aluminum borate whiskers.

8. A prepreg according to claim 4, wherein the thermosetting resin has electrically insulating short fibers dispersed therein, and wherein said thermosetting resin is formed on a roughened surface of a copper foil as the carrier film.

9. A prepreg according to claim 8, wherein the short fibers are at least one member selected from the group consisting of short fibers of aramide fibers, ultra-high molecular weight polyethylene fibers, polyarylate fibers, poly-p-oxybenzoyl whiskers, poly-2-oxy-6-naphthol whiskers, polyoxymethylene whiskers, alumina fibers, magnesia fibers, silica fibers, and zirconia fibers.

10. A prepreg according to claim 1, wherein said whiskers have been surface-treated with a coupling agent.

11. A prepreg according to claim 1, wherein said electrically insulating whiskers or short fibers are included in the prepreg in a range of 5% to 50% by volume.

12. A prepreg according to claim 1, wherein said thermosetting resin having no film-forming ability is selected from the group consisting of epoxy resins, polyimide resins, bismaleimide-triazine resins, phenol resins, melamine resins, silicone resins, unsaturated polyester resins, polyamide resins, cyanic acid ester resins and isocyanate resins.

13. A prepreg according to claim 12, wherein the thermosetting resin has electrically insulating whiskers dispersed therein, and said prepreg does not include a carrier film.

14. A prepreg according to claim 13, wherein the whiskers have an average diameter of 0.3 $\mu$m to 3 $\mu$m, and the whiskers have an average length in a range of from 10 times as large as the average diameter to 100 $\mu$m.

15. A prepreg according to claim 13, wherein the whiskers are aluminum borate whiskers.

16. A prepreg according to claim 13, wherein said thermosetting resin having no film-forming ability is selected from the group consisting of bismaleimide-triazine resins, epoxy resins with no film-forming ability, and polyimide resins with no film-forming ability.

17. A prepreg according to claim 12, wherein the thermosetting resin has electrically insulating whiskers dispersed therein, said thermosetting resin, having electrically insulating whiskers therein, being formed on a carrier film.

18. A prepreg according to claim 17, wherein the whiskers have a modulus of elasticity of 200 GPa or more.

19. A prepreg according to claim 17, wherein the whiskers are at least one member selected from the group consisting of aluminum borate whiskers, wollastonite whiskers, potassium titanate whiskers, basic magnesium sulfate whiskers, silicon nitride whiskers and α-alumina whiskers.

20. A prepreg according to claim 17, wherein the whiskers have an average diameter of 0.3 $\mu$m to 3 $\mu$m, and the whiskers have an average length in a range of from 10 times as large as the average diameter to 100 $\mu$m.

21. A prepreg according to claim 17, wherein said thermosetting resin having no film-forming ability is selected from the group consisting of bismaleimide-triazine resins, epoxy resins with no film-forming ability, and polyimide resins with no film-forming ability.

22. A prepreg according to claim 1, wherein said thermosetting resin having no film-forming ability is selected from the group consisting of epoxy resins with no film-forming ability, bismaleimide-triazine resins, polyimide resins with no film-forming ability, phenol resins, melamine resins, silicone resins, unsaturated polyester resins, cyanic acid ester resins, isocyanate resins and polyamide resins.

23. A prepreg according to claim 1, wherein said prepreg includes said whiskers.

24. A prepreg according to claim 1, wherein said prepreg includes said short fibers.

25. A prepreg for printed circuit boards comprising a semi-cured thermosetting resin composition and electrically insulating whiskers or short fibers, except for glass fibers, dispersed in said semi-cured thermosetting resin composition, said thermosetting resin composition comprising an epoxy resin, a curing agent for the epoxy resin and a curing accelerator, and said epoxy resin having no film-forming ability by itself but the resin composition with said electrically insulating whiskers or short fibers dispersed therein having a film-forming ability, said whiskers having an average length of 100 $\mu$m or less and said short fibers having an average length of 100 times or less of an average diameter of the short fibers, said average diameter of the short fibers being in a range of 0.1 $\mu$m to 15 $\mu$m, whereby migration of copper ions along the whiskers or fibers is prevented.

26. A prepreg according to claim 25, wherein the epoxy resin is at least one member selected from the group consisting of bisphenol A epoxy resin, bisphenol F epoxy resins, bisphenol S epoxy resins, phenol novolak epoxy resins, cresol novolak epoxy resins, bisphenol A novolak epoxy resins, salicylaldehyde novolak epoxy resins, bisphenol F novolak resins, alicyclic epoxy resins, glycidyl ester epoxy resins, glycidylamine epoxy resins, hydration epoxy resins, isocyanurate epoxy resins, aliphatic cyclic epoxy resins, halides thereof, and hydrides thereof.

27. A prepreg according to claim 25, wherein the curing agent is at least one member selected from the group consisting of dicyandiamide, bisphenol A, bisphenol F, polyvinyl phenol, phenol novolak resin, bisphenol A novolak resin, and halides or hydrides of these phenol resins.

28. A prepreg according to claim 25, wherein the curing accelerator is at least one member selected from the group consisting of imidazoles, organic phosphorus compounds, tertiary amines, and quaternary ammonium salts.

29. A prepreg according to claim 25, wherein said prepreg does not include a carrier film.

30. A prepreg according to claim 25, wherein said prepreg is formed on a carrier film, with the resin composition having the whiskers or short fibers dispersed therein being provided on the carrier film.

31. A prepreg according to claim 30, wherein said carrier film is a copper foil having a roughened surface, and wherein the resin composition having the whiskers or short fibers dispersed therein is provided on the roughened surface.

32. A prepreg according to claim 25, wherein the whiskers have an average diameter of 0.3 $\mu$m to 3 $\mu$m, and the whiskers have an average length in a range of from 10 times as large as the average diameter to 100 $\mu$m.

33. A prepreg according to claim 25, wherein the whiskers are at least one member selected from the group consisting of aluminum borate whiskers, wollastonite whiskers, potassium titanate whiskers, basic magnesium sulfate whiskers, silicon nitride whiskers and alpha-alumina whiskers.

34. A prepreg according to claim 25, wherein said prepreg includes said whiskers.

35. A prepreg according to claim 25, wherein said prepreg includes said short fibers.

\* \* \* \* \*